US010783815B2

(12) United States Patent
Wang et al.

(10) Patent No.: US 10,783,815 B2
(45) Date of Patent: Sep. 22, 2020

(54) TESTING APPARATUS AND TESTING METHOD FOR DISPLAY PANEL

(71) Applicant: WUHAN CHINA STAR OPTOELECTRONICS TECHNOLOGY CO., LTD., Wuhan, Hubei (CN)

(72) Inventors: Meihong Wang, Hubei (CN); Peiqian Tong, Hubei (CN)

(73) Assignee: Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 140 days.

(21) Appl. No.: 16/307,748

(22) PCT Filed: Sep. 12, 2018

(86) PCT No.: PCT/CN2018/105258
§ 371 (c)(1),
(2) Date: Dec. 6, 2018

(87) PCT Pub. No.: WO2020/019429
PCT Pub. Date: Jan. 30, 2020

(65) Prior Publication Data
US 2020/0035135 A1 Jan. 30, 2020

(30) Foreign Application Priority Data
Jul. 24, 2018 (CN) .......................... 2018 1 0831300

(51) Int. Cl.
G09G 3/00 (2006.01)
G01R 31/28 (2006.01)

(52) U.S. Cl.
CPC .......... *G09G 3/006* (2013.01); *G01R 31/2825* (2013.01); *G09G 2310/0267* (2013.01); *G09G 2330/02* (2013.01); *G09G 2354/00* (2013.01)

(58) Field of Classification Search
CPC ............. G09G 3/006; G09G 2330/021; G09G 2310/0267; G09G 2330/02;
(Continued)

(56) References Cited

U.S. PATENT DOCUMENTS

2016/0055803 A1    2/2016  Kim et al.
2017/0200412 A1*   7/2017  Gu .......................... G09G 5/005
2019/0189076 A1*   6/2019  Yang ................... G09G 3/3688

FOREIGN PATENT DOCUMENTS

CN    105374319 A    3/2016
CN    106771974 A    5/2017
(Continued)

Primary Examiner — Melissa J Koval
Assistant Examiner — Trung Nguyen
(74) Attorney, Agent, or Firm — Muncy, Geissler, Olds & Lowe, P.C.

(57) ABSTRACT

A testing apparatus and a testing method for a display panel. The testing apparatus includes a microcontroller unit (MCU) module; an electrical monitoring module, a power supply module, and a field programmable gate array (FPGA) module that are connected to the MCU module; a user interface (UI) display module; an optical monitoring module connected to the UI display module; and a gate driver on array (GOA) signal processing module and a digital-to-analog converter (DAC) module that are connected to the FPGA module. The power supply module, the GOA signal processing module, the DAC module, the electrical monitoring module, and the optical monitoring module are connected to a to-be-tested display panel.

14 Claims, 2 Drawing Sheets

(58) Field of Classification Search
CPC ............ G09G 2354/00; G01R 31/2825; G01R 31/343; G01R 35/005; H01L 27/1225; H01L 27/323
USPC ............... 324/500, 600, 76.11, 750.3, 76.49, 324/760.01, 727, 770, 760.02, 762.08, 324/762.09
See application file for complete search history.

(56) References Cited

FOREIGN PATENT DOCUMENTS

| | | |
|---|---|---|
| CN | 107941465 A | 4/2018 |
| CN | 108053785 A | 5/2018 |
| CN | 108172153 A | 6/2018 |
| KR | 20120048748 A | 5/2012 |

\* cited by examiner

TESTING APPARATUS AND TESTING METHOD FOR DISPLAY PANEL

BACKGROUND

Technical Field

The present invention relates to the field of display testing, and in particular, to a testing apparatus and a testing method for a display panel.

Related Art

A flat panel display technology is an indispensable part in modern life, and is applied to a wide variety of fields. Currently, the flat panel display technology is mainly applied to fields such as smart phones, tablet computers, notebook computers, and television sets, and may play an important role in emerging fields such as automotive electronics, industrial control, electronic labels, and smart health care in future. With the popularization of the Internet, and the continuous promotion of trends of intelligentization, a market of display screens as human-machine interfaces expand constantly with an increase in a quantity of terminal devices such as smart phones, and a demand for panels and a shipment area increase annually.

As a panel yield increases annually, after a panel is manufactured, how to more rapidly and effectively detect luminous quality of the panel is a topic of common concern in the panel market. A current detection device usually needs to be connected to various wires. An operation process is relatively complex. In addition, because a testing system needs to be connected to various wires, an interface may be easily in poor contact, leading to an unreliable testing result.

In conclusion, an operation process of an existing testing apparatus for a panel is complex, leading to a long testing time and low panel detection efficiency. This is disadvantageous to detection on mass-produced panels.

SUMMARY

The present invention provides a testing apparatus for a display panel. A field programmable gate array (FPGA) chip and a microcontroller unit (MCU) chip can be integrated, so as to rapidly and effectively drive the display panel. An MCU is used to collect electrical and optical performance parameters of the panel, and analyze luminous quality of the panel, so as to greatly reduce a panel detection time, thereby resolving a problem that an operation process is complex and detection efficiency is affected because an existing detection apparatus for a display needs to be connected to multiple wires.

To resolve the foregoing problem, the technical solutions provided in the present invention are as follows:

The present invention provides a display panel testing apparatus, including:
an MCU module;
an electrical monitoring module, a power supply module, an FPGA module, and a user interface (UI) display module that are connected to the MCU module;
an optical monitoring module connected to the UI display module; and
a gate driver on array (GOA) signal processing module and a digital-to-analog converter (DAC) module that are connected to the FPGA module.

The power supply module, the GOA signal processing module, the DAC module, the electrical monitoring module, and the optical monitoring module are connected to a to-be-tested display panel.

The FPGA module includes a clock module, a serial peripheral interface (SPI) communications module, a GOA time sequence module, and a DAC control module.

The power supply module receives power supply configuration information sent by the MCU module, and supplies power to the display panel.

The GOA signal processing module receives a GOA time sequence signal from the FPGA module, and outputs a corresponding GOA time sequence to the display panel.

The MCU module sends a data voltage signal or image information to the FPGA module, and then outputs, by using the DAC module, a corresponding data voltage or pixel voltage to the display panel.

The MCU module monitors an electrical property and an optical property of the display panel in real time by using the electrical monitoring module and the optical monitoring module respectively.

According to a preferred embodiment of the present invention, the GOA signal processing module includes an analog switch and a GOA output unit. The analog switch is connected to the power supply module, the FPGA module, and the GOA output unit. The GOA output unit is connected to the display panel.

According to a preferred embodiment of the present invention, the DAC module includes a DAC, an operational amplifier, and a DAC output unit.

According to a preferred embodiment of the present invention, the DAC is connected to the FPGA module and the operational amplifier, and the DAC output unit is connected to the operational amplifier and the display panel.

According to a preferred embodiment of the present invention, the power supply module includes a tunable power supply and a power supply output unit. The tunable power supply is connected to the MCU module and the power supply output unit. The power supply output unit is connected to the display panel.

The present invention further provides a testing method for a display panel, including the following steps:

S20: An MCU module sends a GOA time sequence parameter to an FPGA module; the FPGA module sends a corresponding GOA time sequence to a GOA signal processing module; and the GOA signal processing module outputs the GOA time sequence to the display panel.

S30: The MCU module sends a specified data voltage signal to the FPGA module; the FPGA module generates a time sequence for controlling a DAC chip for a DAC module, and outputs the time sequence to the DAC module; and the DAC module generates a corresponding data voltage, and outputs the data voltage to the display panel.

S40: The MCU module sends, to the FPGA module, type information of an image to be lighted up; the FPGA module generates and outputs a time sequence for controlling the DAC chip; and the DAC module generates a corresponding pixel voltage, and outputs the pixel voltage to the display panel.

S50: The MCU module reads current and voltage values of an electrical monitoring module, and records an electrical parameter of the display panel.

S60: A UI display module communicates with an optical monitoring module, to obtain an optical parameter of the display panel.

According to a preferred embodiment of the present invention, the testing method further includes:

S10: The MCU module sends power supply configuration information to a power supply module, and the power supply module outputs a supply voltage to the display panel.

According to a preferred embodiment of the present invention, in step S30, after the DAC module generates the corresponding data voltage, the voltage is amplified by an operational amplifier and then is output to the display panel.

According to a preferred embodiment of the present invention, step S60 further includes:

communicating, by the UI display module with the MCU module, to obtain the electrical parameter of the display panel.

The present invention further provides a testing apparatus for a display panel, including:

an MCU module;

an electrical monitoring module, a power supply module, an FPGA module, and a UI display module that are connected to the MCU module;

an optical monitoring module connected to the UI display module; and a GOA signal processing module and a DAC module that are connected to the FPGA module.

The power supply module, the GOA signal processing module, the DAC module, the electrical monitoring module, and the optical monitoring module are connected to a to-be-tested display panel.

The power supply module receives power supply configuration information sent by the MCU module, and supplies power to the display panel.

The GOA signal processing module receives a GOA time sequence signal from the FPGA module, and outputs a corresponding GOA time sequence to the display panel.

The MCU module sends a data voltage signal or image information to the FPGA module, and then outputs, by using the DAC module, a corresponding data voltage or pixel voltage to the display panel.

The MCU module monitors an electrical property and an optical property of the display panel in real time by using the electrical monitoring module and the optical monitoring module respectively.

According to a preferred embodiment of the present invention, the GOA signal processing module includes an analog switch and a GOA output unit. The analog switch is connected to the power supply module, the FPGA module, and the GOA output unit. The GOA output unit is connected to the display panel.

According to a preferred embodiment of the present invention, the DAC module includes a DAC, an operational amplifier, and a DAC output unit.

According to a preferred embodiment of the present invention, the DAC is connected to the FPGA module and the operational amplifier, and the DAC output unit is connected to the operational amplifier and the display panel.

According to a preferred embodiment of the present invention, the power supply module includes a tunable power supply and a power supply output unit. The tunable power supply is connected to the MCU module and the power supply output unit. The power supply output unit is connected to the display panel.

The beneficial effects of the present invention are as follows: In the present invention, an FPGA chip and an MCU chip are integrated, so that a panel can be rapidly and effectively driven, and electrical and optical properties of the panel can be collected, to analyze luminous quality of the panel.

BRIEF DESCRIPTION OF THE DRAWINGS

To describe the technical solutions in the embodiments or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

Descriptions of the following embodiments are made with reference to the accompanying drawings, so as to exemplarily describe the specific embodiments of the present invention that can be implemented. Terms about directions mentioned in the present invention, such as "on", "below", "front", "back", "left", "right", "in", "out", and "side surface" merely refer to directions in the accompanying drawings. Therefore, the used terms about directions are used to describe and understand the present invention, and are not intended to limit the present invention. In the figures, modules with similar structures are represented by using the same reference number.

In the present invention, for an existing testing apparatus for a display panel, because a detection device needs to be connected to multiple wires, an operation process is complex, and each wire interface may be easily in poor contact, leading to a problem of low detection efficiency. The embodiments can overcome this disadvantage.

Figure 1:
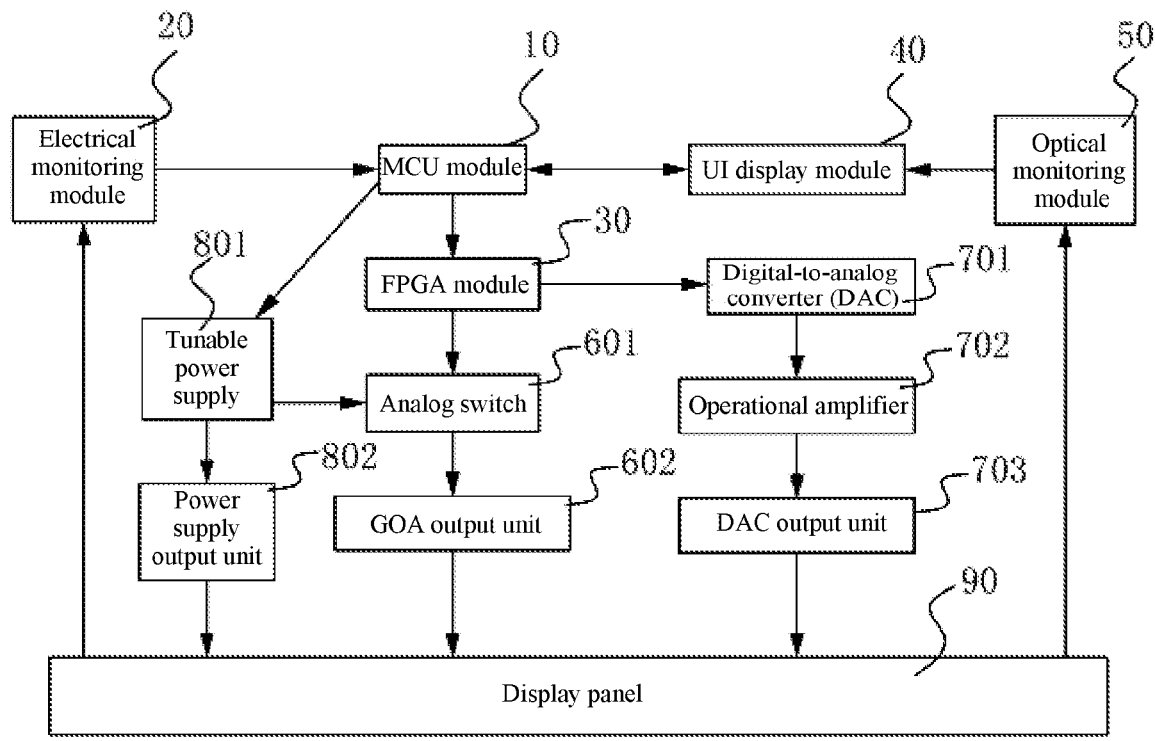
FIG. 1 is a schematic diagram of an entire structure of a testing apparatus for a display panel according to the present invention.

As shown in FIG. 1, the present invention provides a testing apparatus for a display panel, including an MCU module 10, an electrical monitoring module 20, a power supply module, an FPGA module 30, an optical monitoring module 50, a GOA signal processing module, and a DAC module.

The MCU module 10 is connected to the electrical monitoring module 20, a UI display module 40, the FPGA module 30, and the power supply module.

The electrical monitoring module 20, the optical monitoring module 50, the power supply module, the GOA signal processing module, and the DAC module are connected to a to-be-tested display panel 90.

The GOA signal processing module includes an analog switch 601 and a GOA output unit 602.

The DAC module includes a DAC 701, an operational amplifier 702, and a DAC output unit. An input end of the DAC 701 is connected to the FPGA module 30. An output end of the DAC 701 is connected to the operational amplifier 702.

The power supply module includes a tunable power supply 801 and a power supply output unit 802. An input end of the tunable power supply 801 is connected to the MCU module 10. An output end of the tunable power supply 801 is connected to the analog switch 601 and the power supply output unit 802.

The power supply output unit 802, the GOA output unit 602, and the DAC output unit 703 are connected to the display panel 90.

Figure 2:
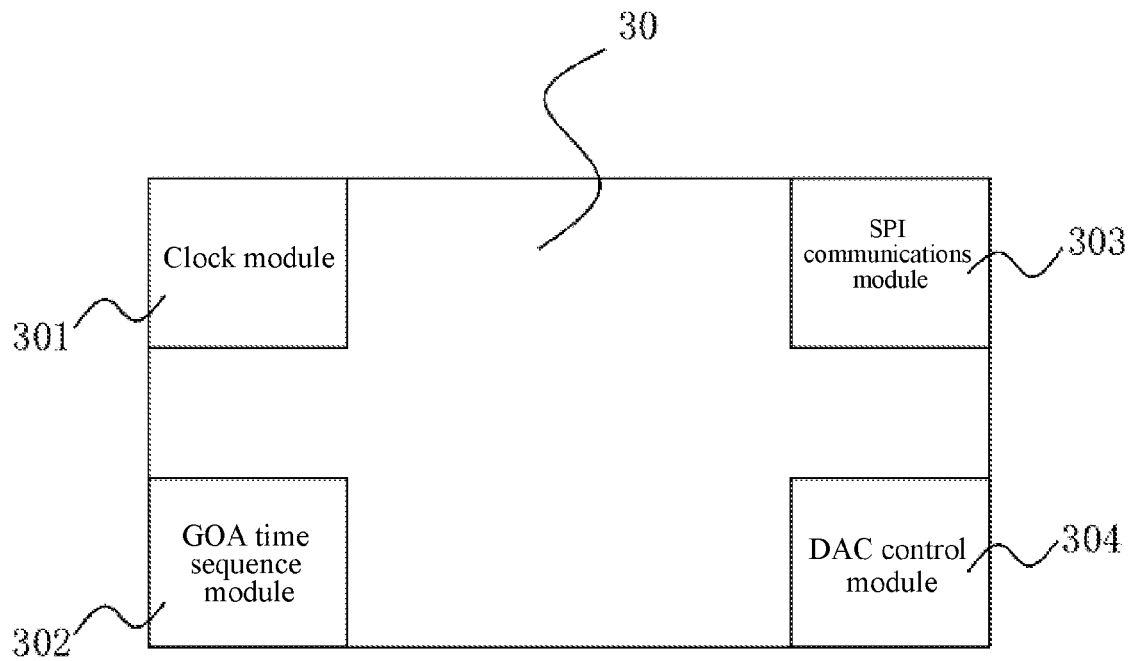
FIG. 2 is a schematic diagram of an internal architecture of an FPGA module in a testing apparatus for a display panel according to the present invention.
Figure 3:
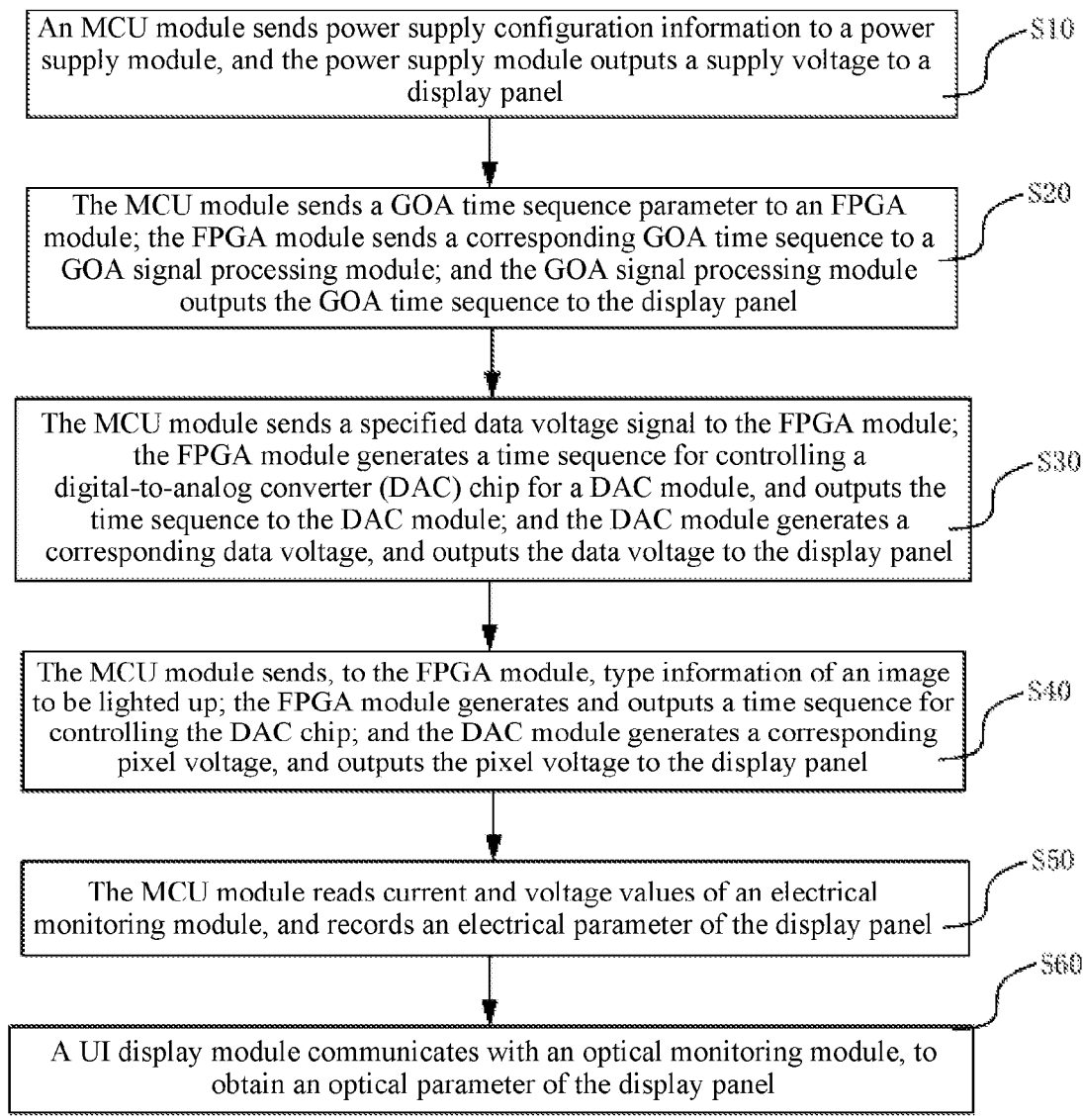
FIG. 3 is a flowchart of steps of a testing method for a display panel according to the present invention.

As shown in FIG. 2, an internal architecture of the FPGA module 30 includes a clock module 301, a GOA time sequence module 302, an SPI communications module 303, and a DAC control module 304. The clock module 301 achieves a function of a timer. The GOA time sequence module 302 is configured to generate a time of opening each pixel gate. The SPI communications module is used by the FPGA module 30 to communicate with the MCU module 10. The DAC control module 304 is configured to control the DAC converter 701, that is, a DAC chip.

The MCU module 10 communicates with the UI display module, and an operator controls the MCU module by using an interface program on the UI display module.

The MCU module 10 controls the power supply module, to control and adjust a voltage required by the display panel 90.

The MCU module 10 transmits, to the FPGA module 30 by using an SPI interface, a GOA time sequence parameter required by the display panel 90. The FPGA module 30 outputs a corresponding GOA time sequence. The analog switch 601 is turned on to receive the GOA time sequence and amplify an amplitude of an alternating-current signal, and output the GOA time sequence to the display panel 90 by using the GOA output unit 602.

The MCU module 10 transmits, to the FPGA module 30 by using the SPI communications module, a data voltage control signal required by the panel. The FPGA module 30 outputs a time sequence that can control the DAC 701, generates a data voltage, amplifies the data voltage by using the operational amplifier 702, and finally, outputs, by using the DAC output unit 703, a data voltage required by the display panel 90.

After the display panel 90 lights up, the MCU module reads current and voltage values of the electrical monitoring module 20 and records data, and communicates with the UI display module 40, to transmit the data to the UI display module 40.

The optical monitoring module 50 communicates with the UI display module 40, and transmits detected optical performance parameters such as chromaticity coordinates and brightness of the display panel 90 to the UI display module 40.

The present invention further provides a testing method for a display panel. The testing method is used by the foregoing testing apparatus to perform a test. The testing method includes the following steps.

S10: An MCU module sends power supply configuration information to a power supply module, and the power supply module outputs a supply voltage to the display panel.

The power supply module includes a tunable power supply and a power supply output unit. The tunable power supply may transform an alternating-current power supply, and provide a required voltage to a to-be-tested display panel. The tunable power supply is controlled by using a software program by using the MCU module as a center. The tunable power supply is flexibly controlled, precision is high, a response speed is high, a small quantity of elements are used, and reliability is high.

S20: The MCU module sends a GOA time sequence parameter to an FPGA module; the FPGA module sends a corresponding GOA time sequence to a GOA signal processing module; and the GOA signal processing module outputs the GOA time sequence to the display panel.

The GOA signal processing module includes an analog switch and a GOA output unit. When the analog switch is in a turned-on state, the analog switch receives the corresponding GOA time sequence, amplifies an alternating-current signal, and outputs, by using the GOA output unit, a GOA time sequence required by the display panel. A corresponding scanning line on the display panel scans a pixel.

S30: The MCU module sends a specified data voltage signal to the FPGA module; the FPGA module generates a time sequence for controlling a DAC chip for a DAC module, and outputs the time sequence to the DAC module; and the DAC module generates a corresponding data voltage, and outputs the data voltage to the display panel.

In addition to the DAC, the DAC module includes an operational amplifier and a DAC output unit. The digital-to-analog converter transmits the output data voltage signal to the operational amplifier, amplifies the data voltage, and then outputs, by using the DAC output unit, a data voltage required by the display panel.

S40: The MCU module sends, to the FPGA module, type information of an image to be lighted up; the FPGA module generates and outputs a time sequence for controlling the DAC chip; and the DAC module generates a corresponding pixel voltage, and outputs the pixel voltage to the display panel.

S50: The MCU module reads current and voltage values of an electrical monitoring module, and records an electrical parameter of the display panel.

S60: A UI display module communicates with an optical monitoring module, to obtain an optical parameter of the display panel.

The UI display module further communicates with the MCU module. On one hand, the MCU module is controlled to further control the FPGA module. On the other hand, the MCU module transmits the electrical parameter of the display panel to the UI display module.

The beneficial effects are as follows: In the present invention, an FPGA chip and an MCU chip are integrated, so that a panel can be rapidly and effectively driven, and electrical and optical properties of the panel can be collected, to analyze luminous quality of the panel.

In conclusion, the present invention has been disclosed through preferred embodiments; however, the preferred embodiments are not intended to limit the present invention, and a person of ordinary skill in the art can make various modifications and improvements without departing from the spirit and scope of the present invention; therefore, the protection scope of the present invention should be subject to the scope defined by the claims.

What is claimed is:

1. A display panel testing apparatus, comprising:
   a microcontroller unit (MCU) module;
   an electrical monitoring module, a power supply module, a field programmable gate array (FPGA) module, and a user interface (UI) display module that are connected to the MCU module;
   an optical monitoring module connected to the UI display module; and
   a gate driver on array (GOA) signal processing module and a digital-to-analog converter (DAC) module that are connected to the FPGA module,
   wherein the power supply module, the GOA signal processing module, the DAC module, the electrical monitoring module, and the optical monitoring module are connected to a to-be-tested display panel;
   the FPGA module comprises a clock module, a serial peripheral interface (SPI) communications module, a GOA time sequence module, and a DAC control module;
   the power supply module receives power supply configuration information sent by the MCU module, and supplies power to the display panel;

the GOA signal processing module receives a GOA time sequence signal from the FPGA module, and outputs a corresponding GOA time sequence to the display panel;

the MCU module sends a data voltage signal or image information to the FPGA module, and then outputs, by using the DAC module, a corresponding data voltage or pixel voltage to the display panel; and the MCU module monitors an electrical property and an optical property of the display panel in real time by using the electrical monitoring module and the optical monitoring module respectively.

2. The testing apparatus according to claim 1, wherein the GOA signal processing module comprises an analog switch and a GOA output unit; the analog switch is connected to the power supply module, the FPGA module, and the GOA output unit; and the GOA output unit is connected to the display panel.

3. The testing apparatus according to claim 1, wherein the DAC module comprises a DAC, an operational amplifier, and a DAC output unit.

4. The testing apparatus according to claim 3, wherein the DAC is connected to the FPGA module and the operational amplifier, and the DAC output unit is connected to the operational amplifier and the display panel.

5. The testing apparatus according to claim 1, wherein the power supply module comprises a tunable power supply and a power supply output unit; the tunable power supply is connected to the MCU module and the power supply output unit; and the power supply output unit is connected to the display panel.

6. A testing method for a display panel, comprising the following steps:

S20: sending, by a microcontroller unit (MCU) module, a gate driver on array (GOA) time sequence parameter to a field programmable gate array (FPGA) module; sending, by the FPGA module, a corresponding GOA time sequence to a GOA signal processing module; and outputting, by the GOA signal processing module, the GOA time sequence to the display panel;

S30: sending, by the MCU module, a specified data voltage signal to the FPGA module; generating, by the FPGA module, a time sequence for controlling a digital-to-analog converter (DAC) chip for a DAC module, and outputting the time sequence to the DAC module; and generating, by the DAC module, a corresponding data voltage, and outputting the data voltage to the display panel;

S40: sending, by the MCU module to the FPGA module, type information of an image to be lighted up; generating and outputting, by the FPGA module, a time sequence for controlling the DAC chip; and generating, by the DAC module, a corresponding pixel voltage, and outputting the pixel voltage to the display panel;

S50: reading, by the MCU module, current and voltage values of an electrical monitoring module, and recording an electrical parameter of the display panel; and S60: communicating, by a user interface (UI) display module with an optical monitoring module, to obtain an optical parameter of the display panel.

7. The testing method according to claim 6, wherein the testing method further comprises:

S10: sending, by the MCU module, power supply configuration information to a power supply module, and outputting, by the power supply module, a supply voltage to the display panel.

8. The testing method according to claim 6, wherein in step S30, after the DAC module generates the corresponding data voltage, the voltage is amplified by an operational amplifier and then is output to the display panel.

9. The testing method according to claim 6, wherein step S60 further comprises:

communicating, by the UI display module with the MCU module, to obtain the electrical parameter of the display panel.

10. A testing apparatus for a display panel, comprising:
a microcontroller unit (MCU) module;
an electrical monitoring module, a power supply module, a field programmable gate array (FPGA) module, and a user interface (UI) display module that are connected to the MCU module;
an optical monitoring module connected to the UI display module; and
a gate driver on array (GOA) signal processing module and a digital-to-analog converter (DAC) module that are connected to the FPGA module, wherein the power supply module, the GOA signal processing module, the DAC module, the electrical monitoring module, and the optical monitoring module are connected to a to-be-tested display panel;

the power supply module receives power supply configuration information sent by the MCU module, and supplies power to the display panel;

the GOA signal processing module receives a GOA time sequence signal from the FPGA module, and outputs a corresponding GOA time sequence to the display panel;

the MCU module sends a data voltage signal or image information to the FPGA module, and then outputs, by using the DAC module, a corresponding data voltage or pixel voltage to the display panel; and the MCU module monitors an electrical property and an optical property of the display panel in real time by using the electrical monitoring module and the optical monitoring module respectively.

11. The testing apparatus according to claim 10, wherein the GOA signal processing module comprises an analog switch and a GOA output unit; the analog switch is connected to the power supply module, the FPGA module, and the GOA output unit; and the GOA output unit is connected to the display panel.

12. The testing apparatus according to claim 10, wherein the DAC module comprises a DAC, an operational amplifier, and a DAC output unit.

13. The testing apparatus according to claim 12, wherein the DAC is connected to the FPGA module and the operational amplifier, and the DAC output unit is connected to the operational amplifier and the display panel.

14. The testing apparatus according to claim 10, wherein the power supply module comprises a tunable power supply and a power supply output unit; the tunable power supply is connected to the MCU module and the power supply output unit; and the power supply output unit is connected to the display panel.

* * * * *